United States Patent
Ker et al.

(10) Patent No.: US 7,676,011 B2
(45) Date of Patent: Mar. 9, 2010

(54) DATA RECOVERY APPARATUS AND METHOD FOR REPRODUCING RECOVERY DATA

(75) Inventors: Ming-Dou Ker, Hsinchu (TW); Chien-Hua Wu, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 845 days.

(21) Appl. No.: 11/308,712

(22) Filed: Apr. 25, 2006

(65) Prior Publication Data

US 2007/0248201 A1    Oct. 25, 2007

(51) Int. Cl.
*H03D 3/24* (2006.01)
(52) U.S. Cl. ............ 375/373; 375/355; 370/395.62; 398/155; 327/156; 327/158; 327/161
(58) Field of Classification Search ............ 375/355, 375/373, 376; 370/395.62; 398/155; 327/156, 327/158, 161
See application file for complete search history.

(56) References Cited

U.S. PATENT DOCUMENTS 6,611,219 B1 * 8/2003 Chen et al. ............ 341/141

2004/0042577 A1    3/2004  Sumiyoshi et al. .......... 375/368
2004/0210790 A1 * 10/2004  Moon et al. ................. 713/500
2005/0047539 A1 *  3/2005  Oh et al. ..................... 375/355

OTHER PUBLICATIONS

Article titled "An 800Mbps Multi-Channel CMOS Serial Link with 3× Oversampling" authored by Kim et al. in 1995, *IEEE*, pp. 451-454.

* cited by examiner

*Primary Examiner*—Mohammad H Ghayour
*Assistant Examiner*—Sung Ahn
(74) *Attorney, Agent, or Firm*—Jianq Chyun IP Office

(57) ABSTRACT

A data recovery apparatus and method for receiving at least an original clock and at least an original data stream output from a transmitter to output at least one recovery data are provided. The original data stream and the recovery data respectively include N steps in a period T of the original clock, wherein N is an integer larger than 0. The data recovery apparatus includes a sampling unit and a processing unit. The sampling unit samples the original data stream according to the original clock, wherein the sampling unit samples the corresponding data of the original data stream at least three times with T/(4N) sample period in each step. The processing unit receives and compares the sampled result output from the sampling unit, and recovers the sampled result to the recovery data according to the compared result.

12 Claims, 12 Drawing Sheets

US 7,676,011 B2

DATA RECOVERY APPARATUS AND METHOD FOR REPRODUCING RECOVERY DATA

BACKGROUND OF THE INVENTION

1. Field of Invention

The present invention relates to a data recovery apparatus and method for reproducing recovery data, and more particularly, to a data recovery apparatus and method with three quarter steps oversampling.

2. Description of Related Art

Electronic circuits are developed towards operating at high-speed and miniaturization. It is a subject worth researching how to transmit data correctly at a high data transmission-rate. Take flat panel displays as an example, with increasing scale flat panel displays, the color intensity and resolution provided by the displays are also increased. The resolutions of SVGA (800×600 pixels) and XGA (1024×768 pixels) have become basic requirements for flat panel displays. The improvement of resolution means the increase of the amount and speed of data transmission. In particular, in the flat panel display system, the most obvious bottleneck encountered in the data transmission is an interface between a clock controller of the LCD and a display card directly connected thereto.

FIG. 1 shows a data transmission interface between the clock controller and the display card in a typical flat panel display. Referring to FIG. 1, the transmission terminal (i.e. display card 110) transmits image signals with 28 bits wide to the receiver (i.e. timing controller 140 in the flat panel display) through a low-voltage differential signaling (LVDS) interface. The LVDS interface comprises an LVDS transmitting unit 120 and an LVDS receiving unit 130. The LVDS transmitting unit 120 uses four multiplexers (MUX) to translate image signals with 28 bits wide output from the display card 110 to 4 bits wide and 7 bits deep LVDS data, and transmits the LVDS data to the LVDS receiving unit 130 in a differential signal form. In an LVDS interface standard, the transmitter 120 additionally transmits a set clock signal pair to the receiver through a phase lock loop PLL. Therefore, the data recovery circuit DRC of the receiver 130 can recover other data by using the clock, and tramslate the 4 bits wide data to a 28 bits wide data. FIG. 2A-2C shows the operation timing of three times oversampling. A conventional clock and data recovery circuits mainly employ a three times oversampling architecture to recover input data for preventing errors induced by skews between the clock and the data, thereby correctly recovering the data inputted.

FIG. 3 shows a conventional architecture of a clock and data recovery circuit in the receiver 130 of FIG. 1. Referring to FIG. 3 and FIG. 2A concurrently, the clock and data recovery circuit comprises input buffers 205 and 210, a data sampler 215, a phase lock loop 220, a synchronizer 225, a phase detector 230, a voter 235, a digital low-pass filter 240, and a phase selector 245. Firstly, the input buffers 205, 210 convert an input data streams Din+, Din− and input clocks CLKin+, CLKin− in the form of LVDS to a form of full swing signals, which is transmitted to the data sampler 215 and the phase lock loop 220 respectively. The phase lock loop 220 locks the full swing input clocks, and provides 21 sampling clocks with different phases to the data sampler 215. The data sampler 215 samples three times for each step of the bit signals d0-d6 and forms a 21 bits wide data stream because of utilizing 21 the sampling clocks with different phases. Then, the synchronizer 225 synchronizes the sampled data output from the data sampler 215.

By comparing the three sampled data in each step (e.g. d0 in FIG. 2A), the phase detector 230 can detect whether the input data stream leads or lags the input clocks. According to the detected result of the bit data d0-d6, the phase detector 230 outputs 7 set signal pairs (each of the signal pairs includes an "upper" bit and a "lower" bit) correspondingly. For example, when the phases of the sampling clocks lag the input data stream, as shown in FIG. 2B, the phase detector 230 detects that the third sampled result is different from the first and second sampled results in each step (e.g. d0) of the input data stream, and the phase detector 230 outputs an "upper" signal to the voter 235 in the corresponding signal pair. On the contrary, when the phases of the sampling clocks lead the input data stream, as shown in FIG. 2C, the phase detector 230 detects that the first sampled result is different from the second and third sampled results in each step (e.g. d0) of the input data stream, and the phase detector 230 outputs a "lower" signal to the voter 235 in the corresponding signal pair.

The voter 235 and the phase detector 230 output the "upper" and "lower" signals to the phase selector 245 in accordance with the number of the output "upper" signals and "lower" signals in the 7 set signal pairs. For example, in a clock period, if there are one "upper" signal and three "lower" signals in the 7 set signal pairs received by the voter 235, the voter 235 outputs the "lower" signals to the phase selector 245.

The digital low-pass filter 240 is used to filter noises to prevent a jitter effect from affecting the detected results. The phase selector 245 receives the the "upper" and "lower" signals output from the voter 235 through the digital low-pass filter 240. If the phase selector 245 receives the "upper" signals output from the voter 235, which means the phase selector 245 receives a detected result with an indicating of "the input data stream Din leads the input clock CLKin", as shown in FIG. 2B, the phase selector 245 shifts the 21 sampled phases upwardly (left in the drawings) by one phase in the next clock period, as shown in FIG. 2A. In contrast, if the phase selector 245 receives the "lower" signals output from the voter 235, which means the phase selector 245 receives a detected result with an indicating of "the input data stream Din leads the input clock CLKin", as shown in FIG. 2C, the phase selector 245 shifts the 21 sampled phases downwardly (right in the figures) by one phase in the next clock period, as shown in FIG. 2A. Finally, the synchronizer 225 recovers the received sampled data to be a recovery data Dout in accordance with the selection results of the phase selector 245.

In conventional technology, when the skew of input data is close to a half step, the three times oversampling architecture cannot distinguish whether the skew leads or lags the sampling clock, which may induce the errors in the recovery data. In addition, as the conventional phase selecting architecture is used with a three times oversampling architecture, 21 sampling clocks are needed in the LVDS receiver applications in flat panel display systems, therefore, the complexity of circuit layout is increased and the layout area is expanded as well.

SUMMARY OF THE INVENTION

Accordingly, an object of the present invention is to provide a data recovery apparatus and method for reproducing recovery data, which uses three quarter steps oversampling to increase the tolerance to an eye diagram of an input data.

Another object of the present invention is to provide a data recovery apparatus and method for reproducing recovery data to significantly reduce the complexity of the layout, and the area of the entire layout for reducing the cost as well. Furthermore, as a phase selecting architecture is replaced with a delay selecting architecture, the number of phases of sampling clocks required is significantly reduced in the entire circuit.

According to the aforementioned objects, the present invention provides a data recovery apparatus, which is used for receiving at least an original clock and at least an original data stream output from a transmitter, and then for outputting at least one recovery data. The original data stream includes N steps in the period T of the original clock, wherein N is an integer larger than 0. The data recovery apparatus includes a sampling unit and a processing unit. The sampling unit samples the original data stream according to the original clock, wherein the sampling unit samples the corresponding data of the original data stream for at least three times with T/(4N) sample period in each step. The processing unit receives and compares the sampled result output from the sampling unit to obtain a compared result of whether the original data stream leads or lags the original data, and recovers the sampled result to recovery data according to the compared result.

From another point of view, the present invention provides a data recovery method, which is used for receiving at least an original clock and at least an original data stream output from a transmitter that is in turn recovered to be at least one recovery data. The original data stream includes N steps in the period T of the original clock, wherein N is an integer larger than 0. The data recovery method comprises sampling the corresponding data of the original data stream for at least three times with T/(4N) sample period in each step; and comparing the sampled results to recover the sampled results to the recovery data.

As the conventional phase selecting architecture is replaced with a delay selecting architecture in the present invention, the entire circuit needs only a few sampling clocks with different phases, which significantly reduces the complexity of the layout, and decreases the area of the entire layout, thereby reducing the cost. In addition, as data are input in a manner of three quarter steps oversampling, the tolerance of the receiver to the eye diagram of input data can be further improved.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
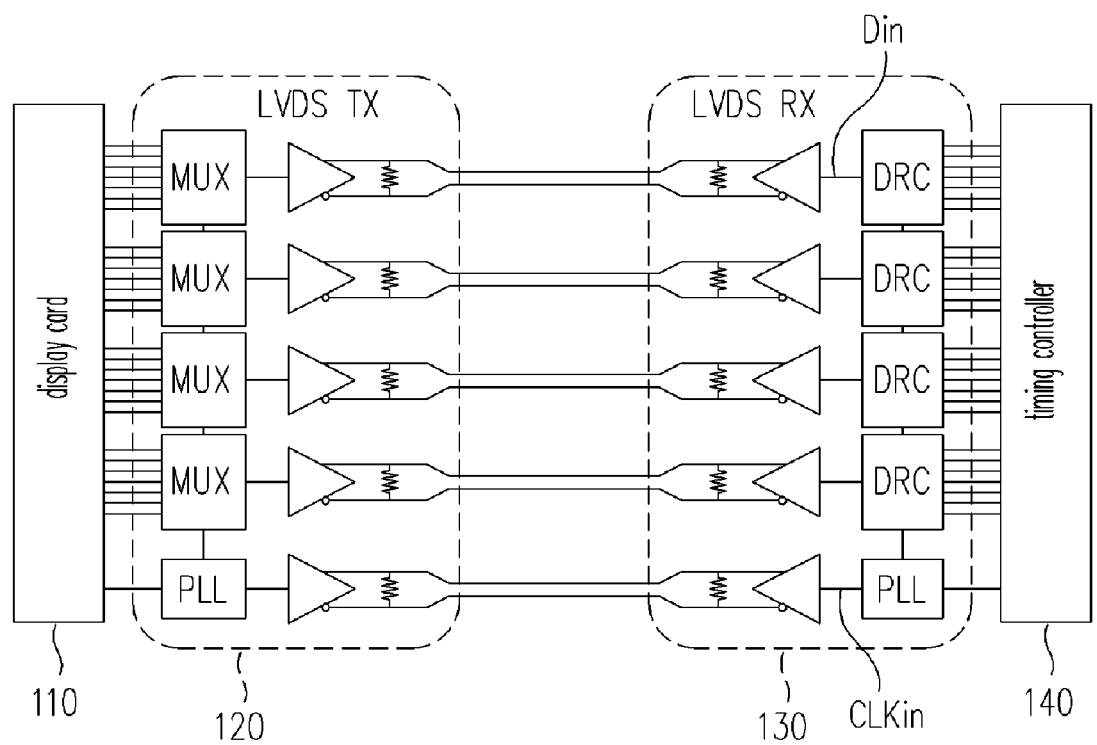
FIG. 1 shows a data transmission interface between a clock controller and a display card in a typical flat panel display.
Figure 2A:
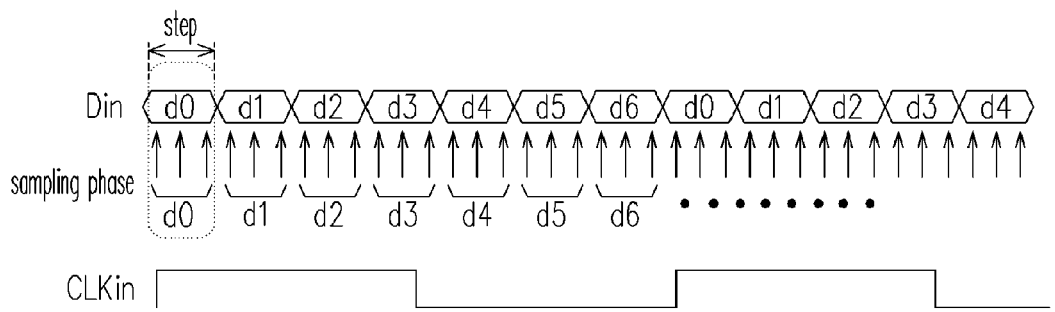
FIGS. 2A-2C show an operation timing of three times oversampling.
Figure 2B:
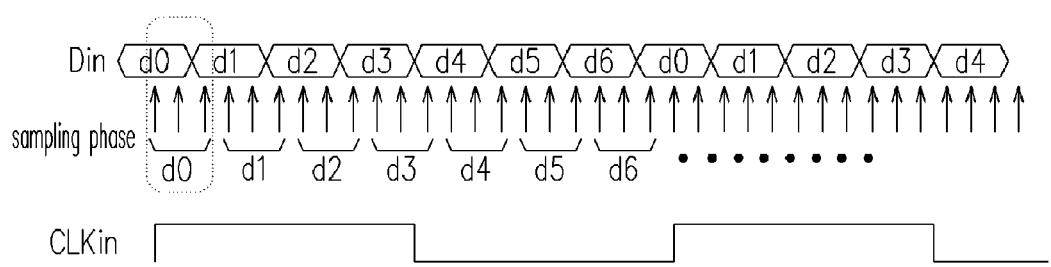
Figure 2C:
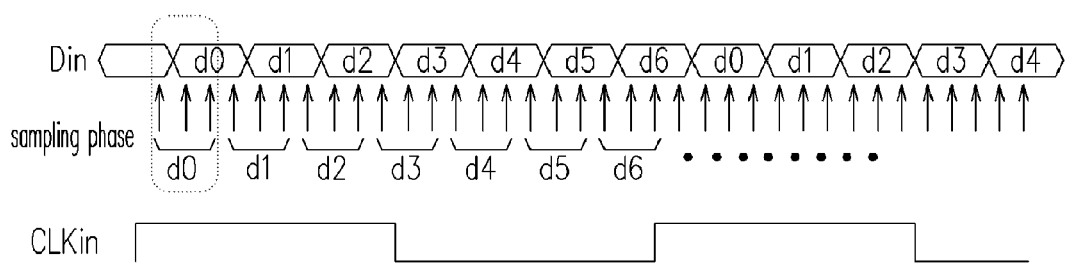

It is a subject worth researching how to transmit data correctly in electronic circuits with a high data transmission rate. Taking flat panel displays as an example, with the increasing scale of flat panel displays, the color density and resolution provided by the displays are also increased. The resolutions of SVGA (800×600 pixels) and XGA (1024'768 pixels) have become basic requirements for flat panel displays. The improvement of resolution means the increase of the amount and rate of data transmission. In particular, in the flat panel display system, the most obvious bottleneck encountered in the data transmission is an interface between a clock controller of an LCD and a display card directly connected thereto, as shown in FIG. 1. When resolutions are SXGA (1280×1024 pixels) and UXGA (1600×1200 pixels), the amount of data transmitted are 784 Mbps and 1155 Mbps, respectively. It is an important subject how to transmit data correctly at such a high data transmission rate.

To facilitate the comparison with the aforementioned conventional technology, a low voltage differential signaling (LVDS) interface is still taken as an embodiment of the present invention here, however the present invention should not be thus limited thereto. FIG. 4 shows a circuit diagram of the phase lock loop 220 in FIG. 3. A general phase lock loop 200 includes a phase frequency detector (PFD) 410, a charge pump 420, a bias voltage generator 430, and a voltage controlled oscillator 440. A common phase lock loop architecture is implemented as the phase lock loop 220 here, thus the operation thereof will not be described any more. In the phase lock loop 220, the voltage controlled oscillator 440 consists of 21 voltage controlled oscillating cells connected in series such that the voltage controlled oscillating cells provide 21 sampling clocks with different phases to the data sampler 215 in a clock period. However, a large number of voltage controlled oscillating cells occupy a large circuit area.

Figure 5:
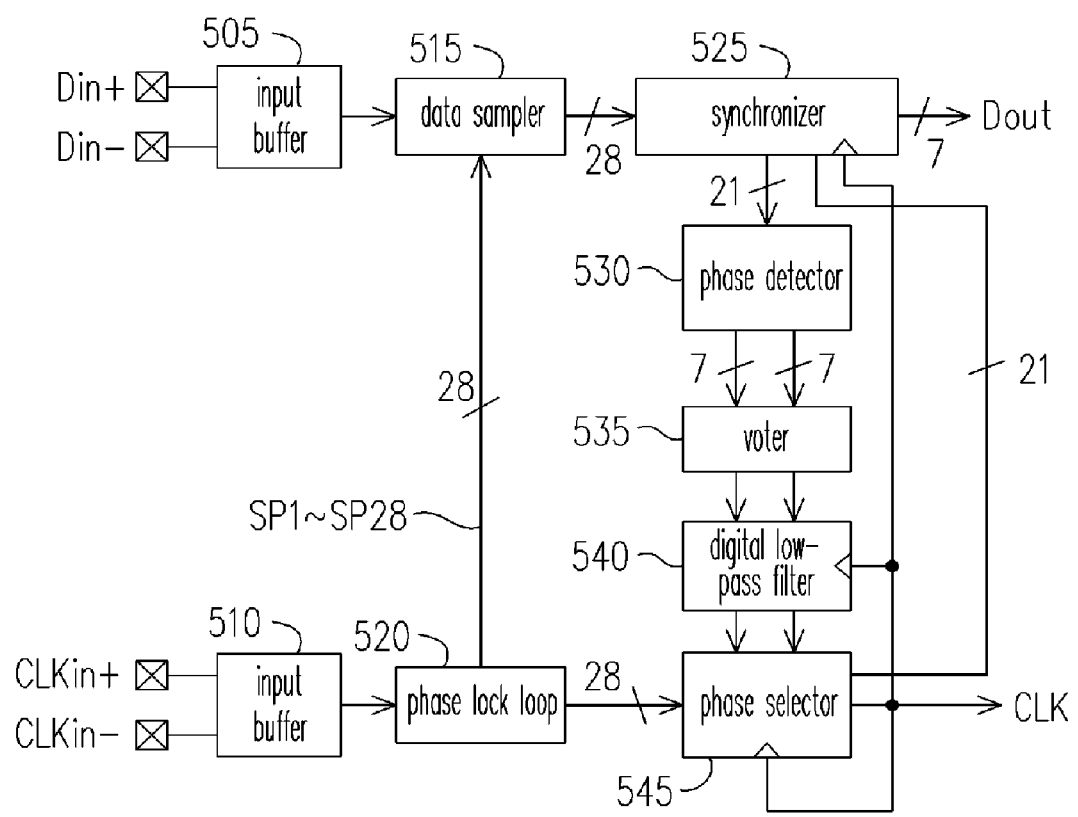
FIG. 5 shows a data recovery circuit employing three quarter steps oversampling according to the embodiment of the present invention.
Figure 6A:
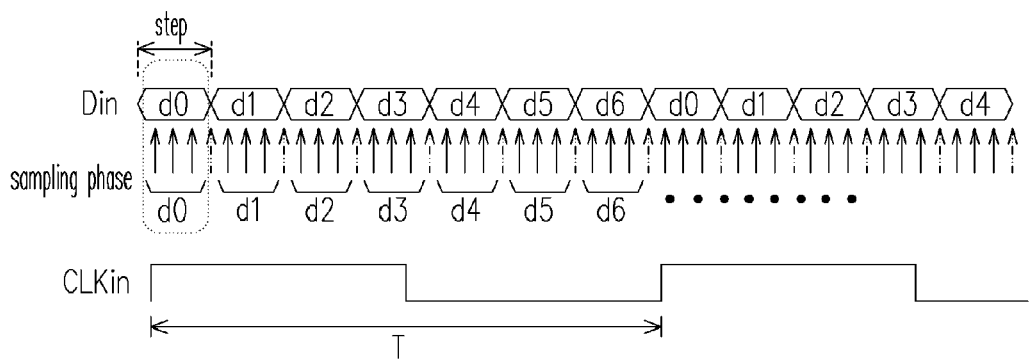
FIGS. 6A-6C show timing diagrams of the three quarter steps oversampling according to the embodiment of the present invention.
Figure 6B:
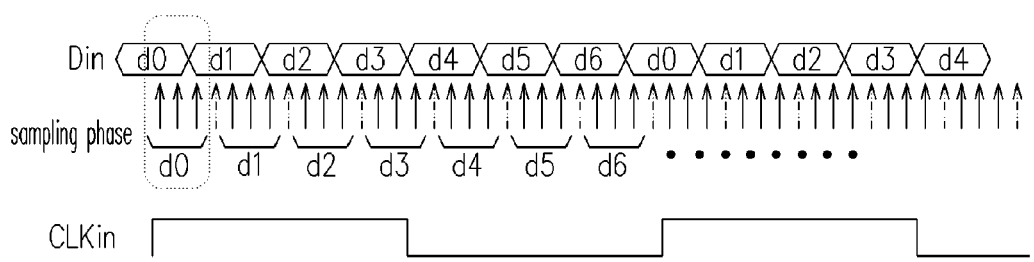
Figure 6C:
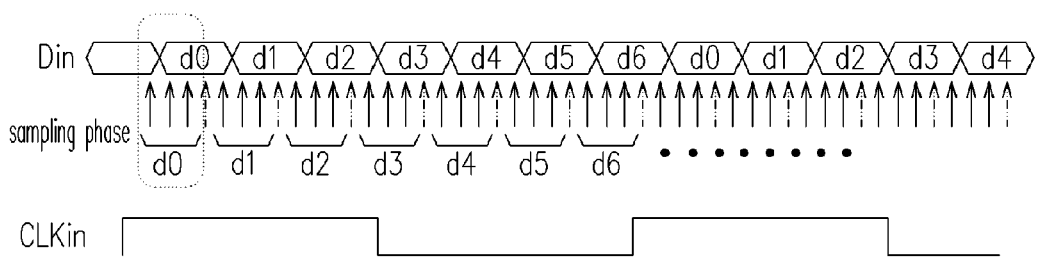

This embodiment employs a three quarter steps oversampling architecture, thus for an LVDS interface standard, 28 sampling clocks with different phases are needed to be supplied to a data sampler. FIG. 5 shows a clock and data recovery circuit employing the three quarter steps oversampling according to the embodiment of the present invention. FIGS. 6A-6C show timing diagrams of the three quarter steps oversampling according to the embodiment of the present invention. Referring to FIGS. 5 and 6A together, the data recovery circuit receives at least one original clock CLKin (including CLKin+ and CLKin−) and at least one original data stream Din (including Din+ and Din−) provided by a transmitter (not shown) to output at least one recovery data Dout. Wherein, the original data stream includes N steps in the period T of the original clock, wherein N is an integer larger than 0, and N=7 in this embodiment. The data recovery apparatus includes a sampling unit and a processing unit. The sampling unit comprises input buffers 505 and 510, a data sampler 515, a phase lock loop 520 etc., for sampling the original data stream Din according to the original clock CLKin, wherein corresponding data (e.g. d0 in FIG. 6A) of the original data stream Din are sampled for at least three times with T/(4N) period in each step. In this embodiment, the aforementioned processing unit comprises a synchronizer 525, a phase detector 530, a voter 535, a digital low-pass filter 540, and a phase selector 545, for receiving and comparing the sampled results output from the sample unit to obtain a compared result of whether the original data stream leads or lags the original data, and recovering the sampled results to the recovery data Dout according to the compared results.

Figure 3:
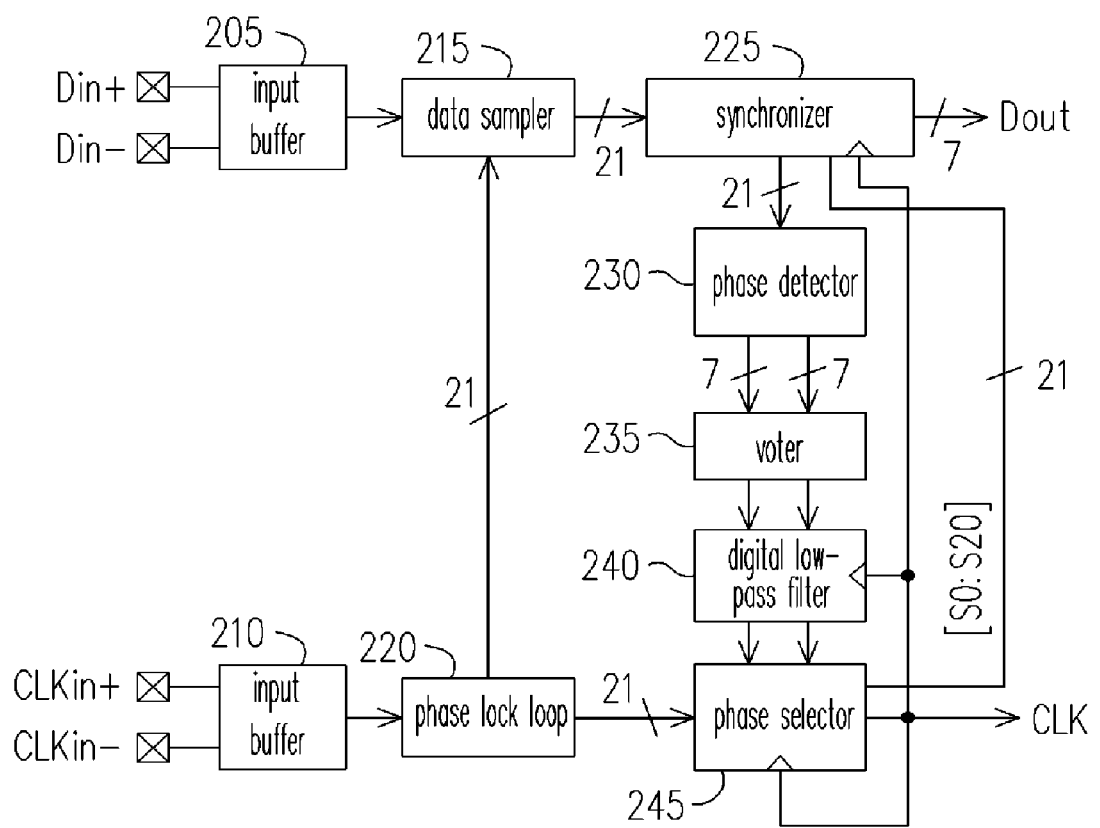
FIG. 3 shows the conventional architecture of a clock and data recovery circuit in the receiver of FIG. 1.
Figure 4:
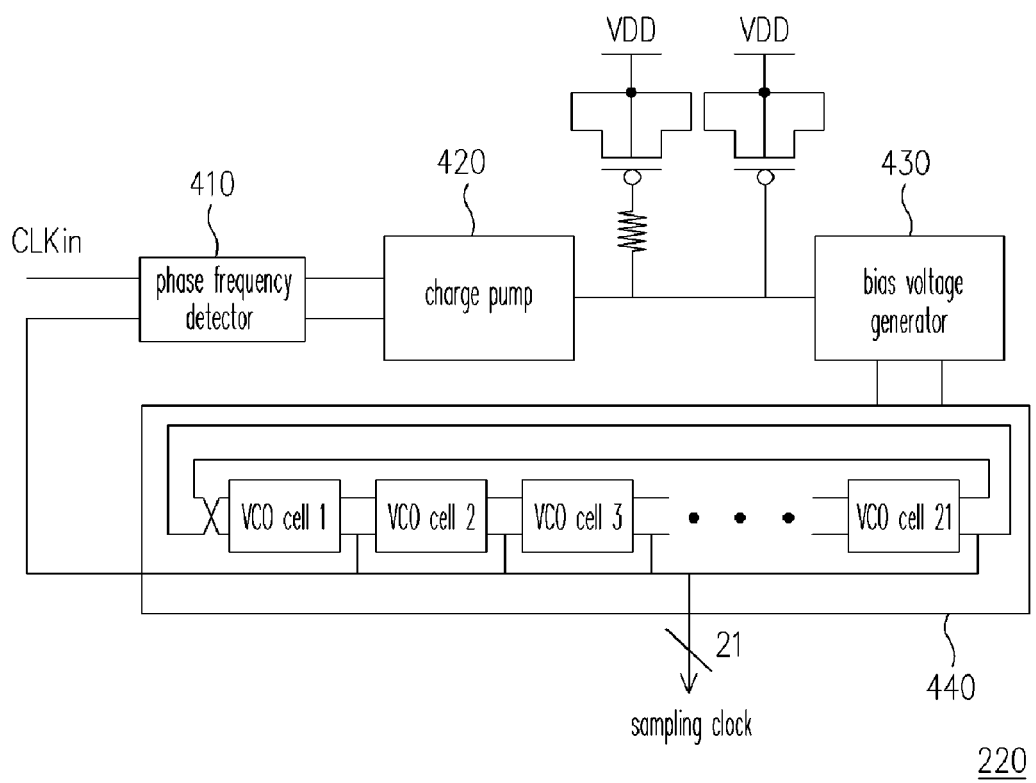
FIG. 4 shows a circuit diagram of the phase lock loop shown in FIG. 3.

The clock and data recovery circuit of this embodiment shown in FIG. 5 can be similar to that shown in FIG. 3, except the sampler 515, the phase lock loop 520, and the synchronizer 525, so the description on the same part is omitted. The Phase lock loop 520 locks the input clock CLKin, and provides 28 sampling clocks with different phases to the data sampler 515 at a clock period. The Data sampler 515 samples four times in each step of the bit data d0-d6 to form a 28-bit wide data stream and output it to the synchronizer 525 since the 28 sampling clocks with different phases are used. Then, the synchronizer 525 synchronizes the sampled data output from the data sampler 515. The Synchronizer 525 selects three data from among the four data sampled in each step (e.g. bit data d0) and outputs them to the phase detector 530.

Figure 6D:
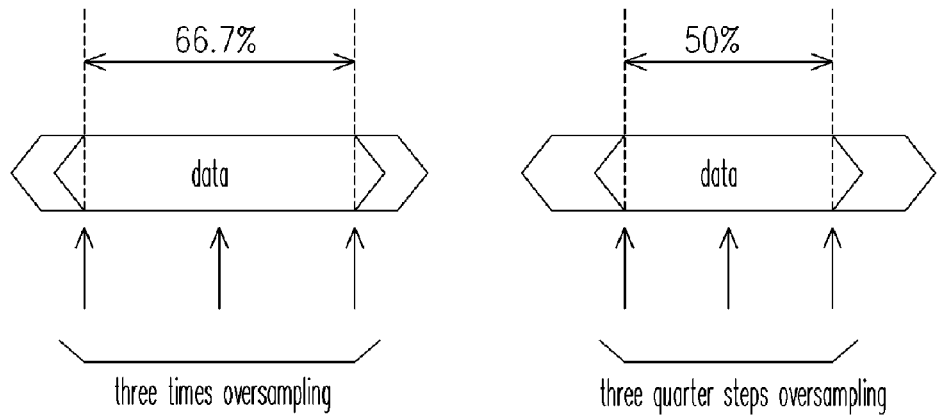
FIG. 6D respectively shows tolerances to eye diagram of input signal of the three times oversampling and the three quarter steps oversampling according to the embodiment of the present invention.

FIG. 6D respectively shows tolerances to an eye diagram of input signal of the three times oversampling and the three quarter steps oversampling according to the embodiment of the present invention. Since data are input with three quarter steps oversampling in this embodiment, the receiver's tolerance to the eye diagram of the input signal can be further improved so as to correctly recover the input data.

By comparing the three sampled data in each step (e.g. d0 in FIG. 6A), the phase detector 530 can detect whether the input data stream Din leads or lags the input clock CLKin. In the period T, the phase detector 530 outputs a phase detected result (7 set signal pairs here, each set signal pair comprises an "upper" bit and a "lower" bit) corresponding to each step. For example, when the phase of the sampling clock lags the input data stream Din, as shown in FIG. 6B, the phase detector 530 detects that the third sampled result is different from the first and second sampled results in each step (e.g. d0) of the input data stream Din, thus the phase detector 530 outputs an "upper" signal in the corresponding signal to the voter 535. On the contrary, when the phase of the sampling clock leads the input data stream Din, as shown in FIG. 6C, the phase detector 530 detects that the first sampled result is different from the second and third sampled results in each step (e.g. d0) of the input data stream Din, thus the phase detector 530 outputs a "lower" signal in the corresponding signal to the voter 535.

The Voter 535 determines and outputs the period phase detected result according to the corresponding phase detected result of each step in the current period T. The digital low-pass filter 540 filters noises. The phase selector 545 receives the period phase detected result output from the voter 535 via the digital low-pass filter 540, according to which the phase selector 545 selects one of the sampling clocks generated by the phase lock loop 520 as an internal clock CLK. Wherein the synchronizer 525 further selects 7 data from among the sampled results output from the sampling unit according to the selection results of the phase selector 545, and outputs the 7 selected data in parallel as the recovery 7 bits wide data Dout according to the timing of the internal clock CLK.

Figure 7:
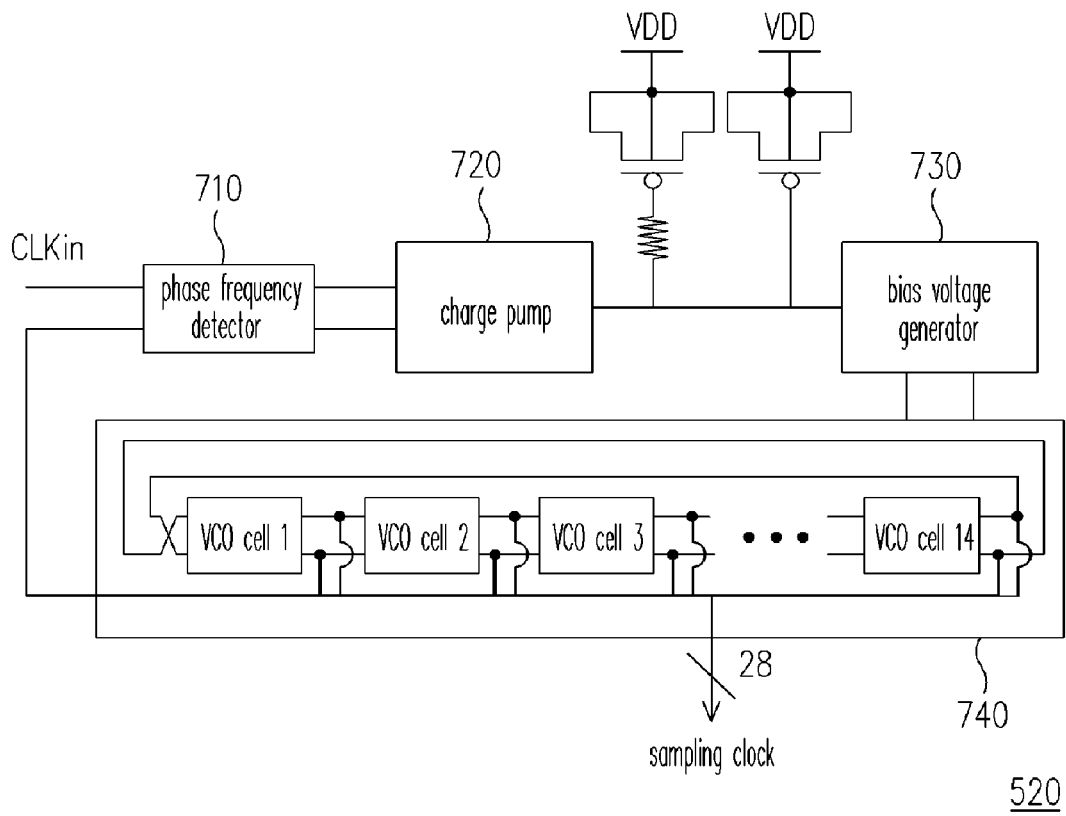
FIG. 7 shows a circuit diagram of the phase lock loop shown in FIG. 5 according to the embodiment of the present invention.

FIG. 7 shows a circuit diagram of the phase lock loop 520 in FIG. 5 according to the embodiment of the present invention. Referring to FIG. 5 and FIG. 7 together, the phase lock loop 520 comprises a phase frequency detector 710, a charge pump 720, a bias voltage generator 730, and a voltage controlled oscillator 740. A common phase lock loop architecture is implemented as the phase lock loop 520 here, thus the operation thereof will not be described any more. In the phase lock loop 520, the voltage controlled oscillator 740 consists of only 14 voltage controlled oscillating cells connected in series. As each of the voltage controlled oscillating cells has LVDS interface, the 14 voltage controlled oscillating cells can provide 28 sampling clocks with different phases to the data sampler 515 in a clock period.

In comparison with the conventional phase lock loop 220 (as shown in FIG. 4) which has to form the voltage oscillator 440 with 21 voltage controlled oscillating units, the voltage controlled oscillator 740 of this embodiment needs only 14 voltage controlled oscillating units. Therefore, this embodiment greatly reduces the circuit area occupied by phase lock loop. In addition, as data are input with the three quarter steps oversampling in this embodiment, the tolerance of the receiver to the eye diagram of input data can be further improved.

Figure 8:
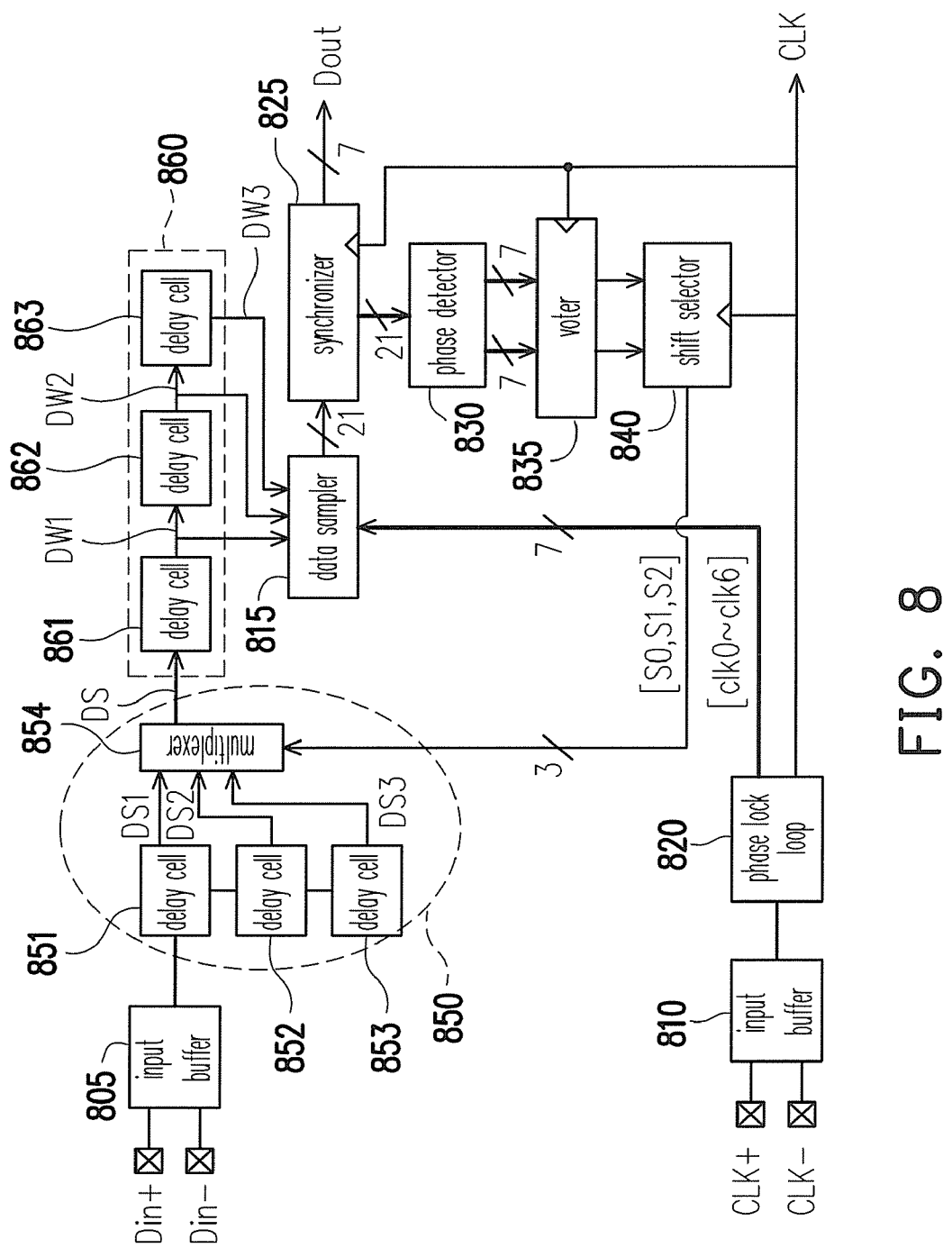
FIG. 8 shows a clock and data recovery circuit employing three quarter steps oversampling according to the embodiment of the present invention.
Figure 9:
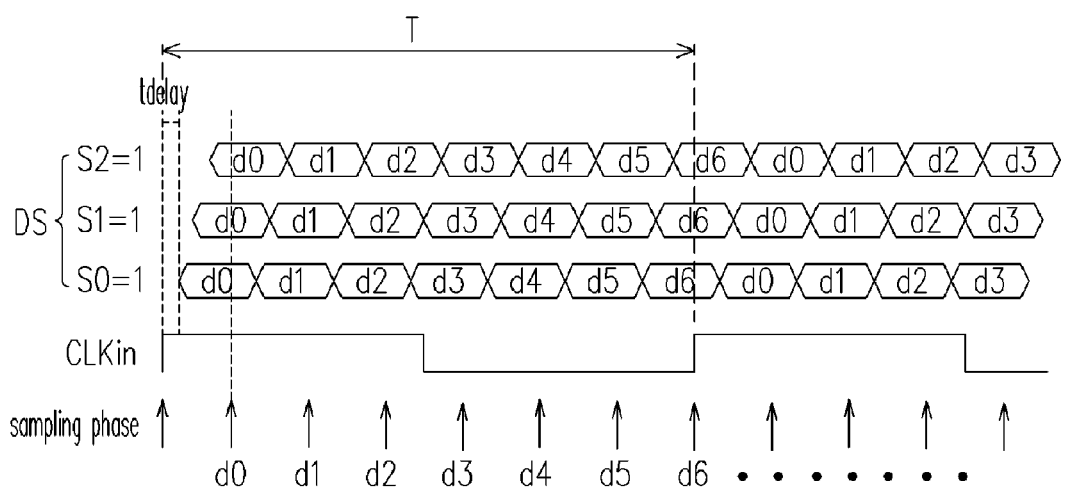
FIG. 9 shows a timing diagram of the three quarter steps oversampling according to the embodiment of the present invention.

To facilitate comparison with the conventional technology, the LVDS interface is still taken as the embodiment of the present invention below. FIG. 8 shows a clock and data recovery circuit employing the three quarter steps oversampling according to the embodiment of the present invention. FIG. 9 shows a timing diagram of the three quarter steps oversampling according to the embodiment of the present invention. Referring to FIGS. 8 and 9 together, the data recovery circuit receives at least one original clock CLKin (including CLKin+ and CLKin−) and at least one original data stream Din (including Din+ and Din−) provided by a transmitter (not shown) to output at least one recovery data Dout. The original data stream Din includes N steps in the period T of the original clock CLKin, wherein N is an integer larger than 0, and here N=7. The data recovery apparatus includes a sampling unit and a processing unit. The sampling unit comprises input buffers 805 and 810, a delay selector 850, a detection window unit 860, a data sampler 815, a phase lock loop 820 etc., for sampling the original data stream Din according to the original clock CLKin, wherein corresponding data of the original data stream Din are sampled at least three times with T/(4N) period in each step. The processing unit comprises a synchronizer 825, a phase detector 830, a voter 835, and a shift selector 840, for receiving and comparing the sampled results output from the sample unit to obtain a compared result of whether the original data stream leads or lags the original data, and recovering the sampled results to the recovery data Dout according to the compared results.

The input buffers 805, 810 convert the input data streams Din+, Din− and the input clocks CLKin+, CLKin− in the form of LVDS to the form of full swing signals respectively, which are transmitted to the delay selector 850 and the phase lock loop 820. The phase lock loop 820 locks the input clocks in the full swing form, and provides 7 sampling clocks clk0-clk6 with different phases to the data sampler 815. In addition, the phase lock loop 820 further generates internal clocks CLK to the trigger synchronizer 825, the voter 835, and the shift selector 840.

The delay selector 850 receives the original data stream Din so as to determine delay time of the original data stream Din according to the shift control signals S0, S1, S2 output from the shift selector 840, and to output the selected delay data stream DS. In this embodiment, the delay selector 840 comprises a first delayer 851, a second delayer 852, a third delayer 835, and a multiplexer 854. The first delayer 851 receives the original data stream Din via the input buffer 805, and delays the original data stream Din and then outputs a first delayed data stream DS1. The second delayer 852 receives the first delayed data stream DS1 output from the first delayer 851, and delays the first delayed data stream DS1 (the delay time is set to be tdelay) and then outputs a second delayed data stream DS2. The third delayer 853 receives the second delayed data stream DS2 output from the second delayer 852, and delays the second delayed data stream DS2 and then outputs a second delayed data stream DS2. The multiplexer 854 selects one of the first delayed data stream DS1, the second delayed data stream DS2, and the third delayed data stream DS3 according to the shift control signals S0, S1, S2, and outputs it as a selected delayed data stream DS. For example, when the shift control signal S0=1, the multiplexer 854 selects to output the first delayed data stream DS1 of the first delayer 851 as the selected delayed data stream DS; when the shift control signal S2=1, the multiplexer 854 selects to output the third delayed data stream DS3 of the third delayer 853 as the selected delayed data stream DS.

Figure 10A:
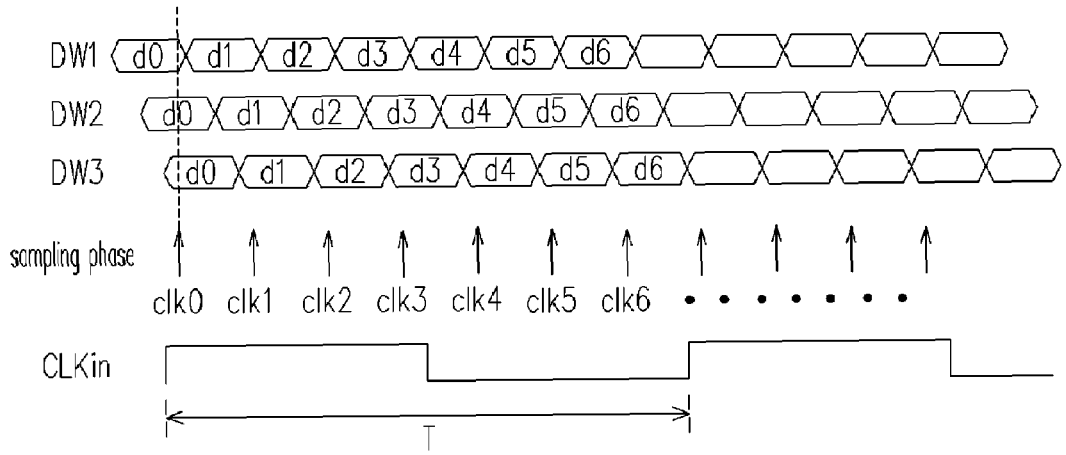
FIGS. 10A-10C show timing diagrams of data streams with different phases output from a sample detection window unit of a data sampler according to the embodiment of the present invention.
Figure 10B:
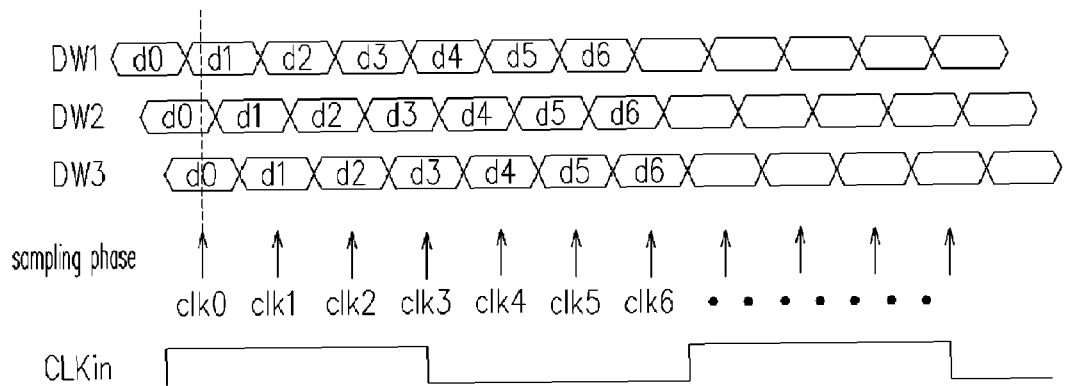
Figure 10C:
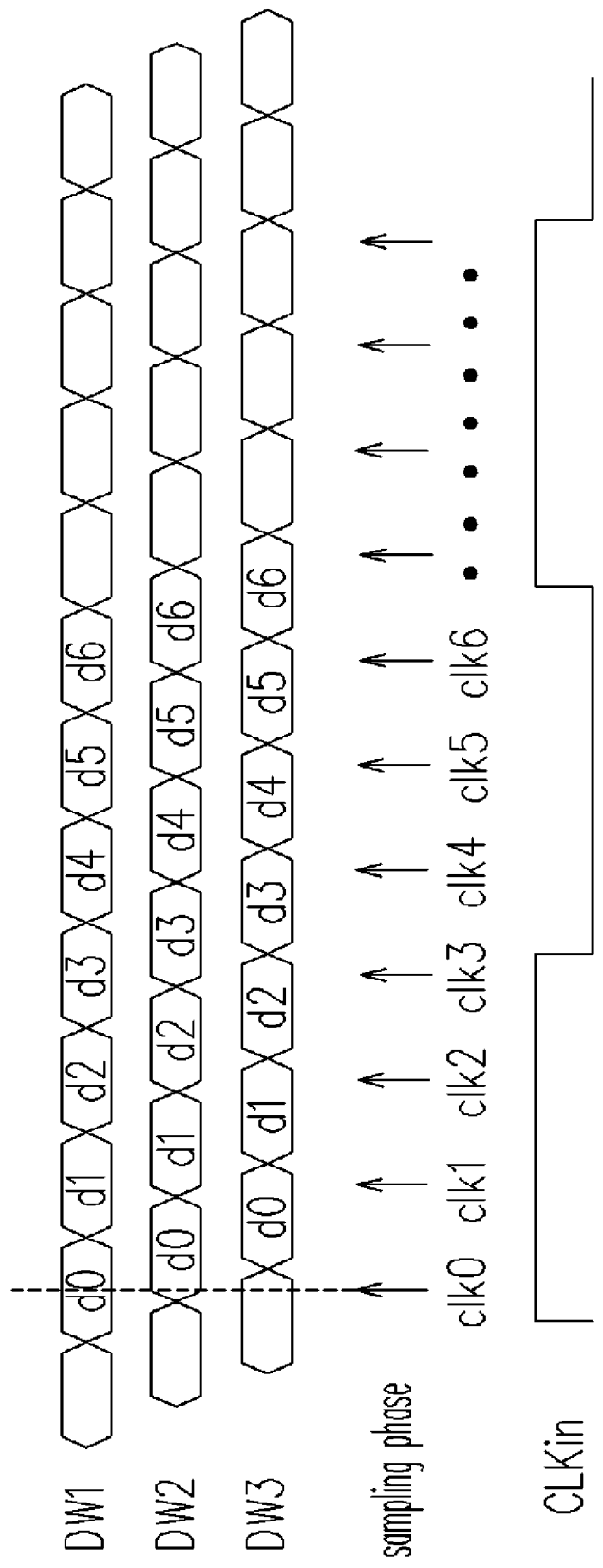

FIGS. 10A-10C show timing diagrams of data streams with different phases output from the sample detection window unit 860 of the data sampler 815 according to the embodiment of the present invention. Referring to FIGS. 8 and 10A together, the detection window unit 860 is electrically connected to the delay selector 850. The detection window unit 860 receives and delays the data streams output from the delay selector 850, to output at least three data streams with different phases (e.g. data streams DW1, DW2 and DW3 in FIG. 8). In this embodiment, the detection window unit 860 includes a fourth delayer 861, a fifth delayer 862, and a sixth delayer 863. The fourth delayer 861 is electrically connected to the delay selector 850. The fourth delayer 861 receives the selected delayed data stream DS output from the delay selector 850, and outputs a fourth delayed data stream DW1 after delaying the selected delayed data stream DS. The fifth delayer 862 receives the fourth delayed data stream DW1 output from the fourth delayer 861, and outputs a fifth delayed data stream DW2 after delaying the fourth delayed data stream DW1. The sixth delayer 863 receives the fifth delayed data stream DW2 output from the fifth delayer 862, and outputs a sixth delayed data stream DW3 after delaying the fifth delayed data stream DW2. Here, the delay time between delayed data streams DW1, DW2, and DW3 is set to T/(4N), and as for the LVDS interface, the delay time is T/28. The data sampler 815 samples the fourth delayed data stream DW1, the fifth delayed data stream DW2, and the sixth delayed data stream DW3 according to the sampling clocks clk0-clk6 output from the phase lock loop 820, and outputs the sampled results to the processing unit.

In the processing unit, the synchronizer 825 synchronizes the 21 sampled results output from data sampler 815 of the sampling unit. The phase detector 830 detects whether each step of the period T of the original data stream Din leads or lags the timing of the original clock CLKin by comparing the output of the synchronizer 825, and outputs the phase detected result corresponding to each step in the period T. By comparing the three sampled data in each step (e.g. d0 in FIG. 10A), the phase detector 830 can detect whether the input data stream Din leads or lags the input clock CLKin. In the period T, the phase detector 830 outputs a phase detected result (7 set signal pairs here, each of the signal pairs comprises an "upper" bit and a "lower" bit) corresponding to each step. The voter 835 determines and outputs the period phase detected result according to the corresponding phase detected result of each step in the current period T. The shift selector 840 receives the period phase detected result output from the voter 835, and generates shift control signals S0, S1, and S2 in accordance with the period phase detected result, so as to control the delay selector 850 to determine the delay time of the original data stream Din.

Figure 11:
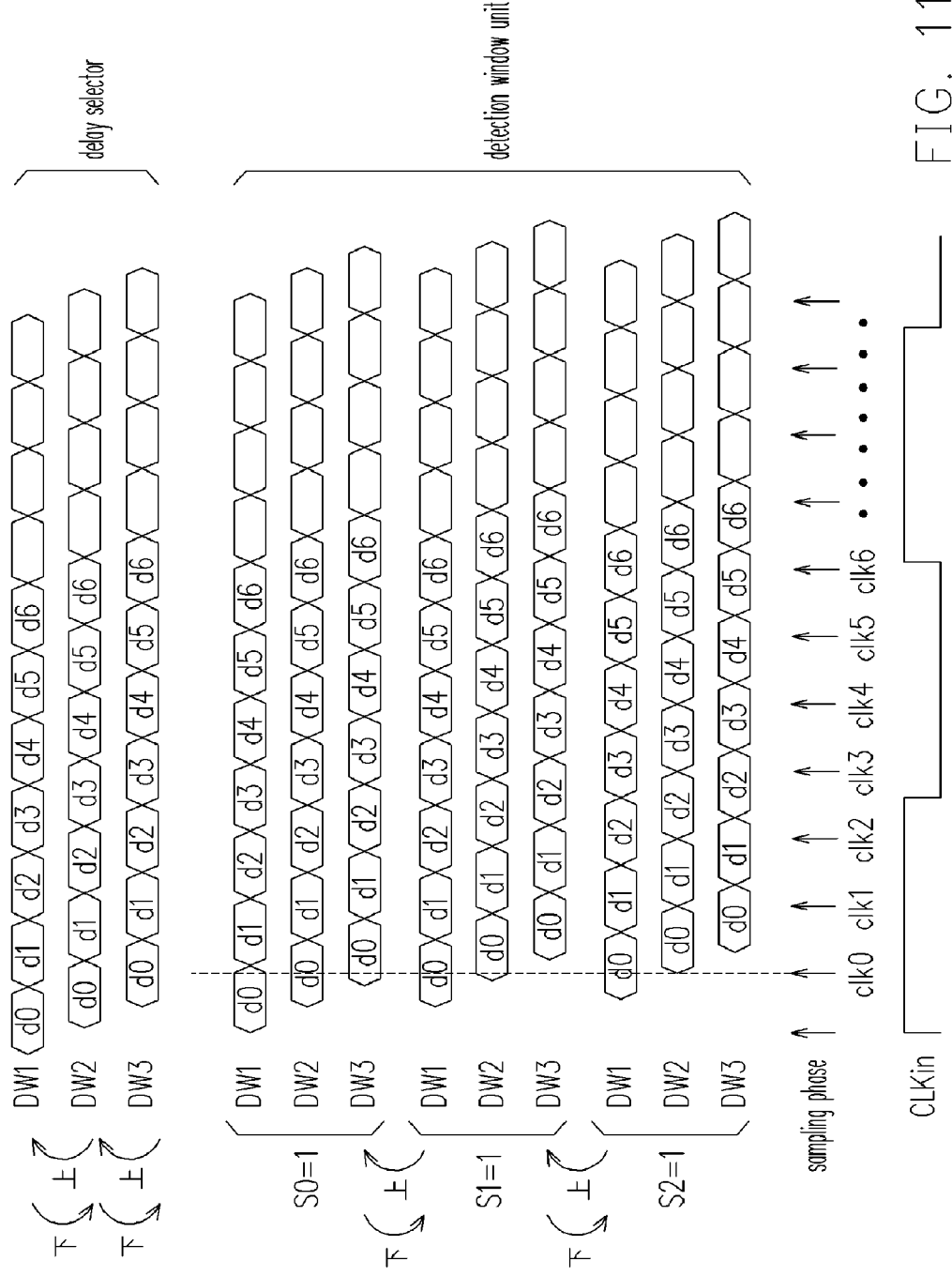
FIG. 11 shows operation procedure of related signals in FIG. 8 according to the embodiment of the present invention.

For example, when the phase of the sampling clock (e.g. clk0) lags the input data stream Din (e.g. bit data d0), as shown in FIG. 10B, the phase detector 830 detects that the third sampled result (i.e. the sampled result of the delayed data stream DW1) is different from the first and second sampled results (i.e. the sampled results of the delayed data streams DW3 and DW2) in each step (e.g. d0) of the input data stream Din, the phase detector 830 outputs an "upper" signal in the corresponding signal pair to the voter 835. On the contrary, when the phase of the sampling clock (e.g. clk0) leads input data stream Din (e.g. bit data d0), as shown in FIG. 6C, the phase detector 830 detects that the first sampled result (i.e. the sampled result of the delayed data stream DW3) is different from the second and third sampled results (i.e. the sampled results of the delayed data streams DW3 and DW2) in each step (e.g. d0) of input data stream Din, the phase detector 530 outputs a "lower" signal in the corresponding signal pair to the voter 535. The operation procedure of the related signals can be described with reference to FIG. 11.

The synchronizer 825 further selects 7 data from the sampled results output from data sampler 815 of the sampling unit according to the selection results of the shift selector 840, and outputs the 7 selected data in parallel as the 7 bits wide recovery data Dout according to the timing of internal clock CLK.

To summarize, as the conventional phase selecting architecture is replaced with the delay selecting architecture in the present invention, the entire circuit needs only a few sample clocks with different phases, which significantly reduces the complexity of the layout, and decreases the area of the entire layout, whereby the object of reducing the cost is achieved. In addition, as data are input with the three quarter steps oversampling, the tolerance of the receiver to the eye diagram of input data can be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data recovery apparatus for receiving at least an original clock and at least an original data stream provided by a transmitter to output at least one recovery data, wherein the original data stream comprises N steps in a period T of the original clock, N is an integer larger than 0, and the data recovery apparatus comprises:

a sampling unit for sampling the original data stream according to the original clock, wherein corresponding data of the original data stream are sampled for three times with T/(4N) sample period in each step; and a processing unit electrically connected to the sampling unit, for receiving and comparing the sampled results output from the sampling unit to obtain a compared result of whether the original data stream leads or lags the original data, and recovering the sampled results to be the recovery data according to the compared results, wherein the sampling unit comprises:

a phase lock loop for generating at least an internal clock and N sampling clocks with different phases according to the original clock;

a delay selector for receiving the original data stream to determine the delay time of the original data stream according to a shift control signal, and outputting selected delay data streams;

a detection window unit electrically connected to the delay selector, for receiving and delaying data streams output from the delay selector to output at least three data streams with different phases; and a data sampler electrically connected to the phase lock loop and the detection window unit, for sampling the data streams output from the detection window unit according to each of the sampling clocks output from the phase lock loop, and outputting the sampled results to the processing unit.

2. The data recovery apparatus as claimed in claim 1, wherein the sampling unit comprises:

a phase lock loop for generating at least 4N sampling clocks with different phases according to the original clock; and a data sampler electrically connected to the phase lock loop, for sampling the original data stream according to the 4N sampling clocks with different phases, and outputting the sampled results to the processing unit.

3. The data recovery apparatus as claimed in claim 2, wherein the processing unit comprises:

a synchronizer electrically connected to the sampling unit, for synchronizing the sampled results output from the sampling unit;

a phase detector electrically connected to the synchronizer, for detecting whether each step of the period T of the original data stream leads or lags the timing of the original clock by comparing an output of the synchronizer, and outputting phase detected results corresponding to each step of the period T;

a voter electrically connected to the phase detector, for determining and outputting a period phase detected result according to the phase detected result corresponding to each step in the current period T;

a digital low-pass filter electrically connected the voter for filtering noises; and a phase selector electrically connected to the digital low-pass filter, for receiving the period phase detected result via the digital low-pass filter, and selecting one of the sampling clocks generated by the phase lock loop as an internal clock;

wherein the synchronizer further selects N data from the sampled results output from the sampling unit according to selection results of the phase selector, and outputs the N selected data as the recovery data according to the timing of the internal clock.

4. The data recovery apparatus as claimed in claim 1, wherein the delay selector comprises:

a first delayer for receiving the original data stream, and outputting a first delayed data stream after delaying the original data stream;

a second delayer electrically connected to the first delayer, for receiving the first delayed data stream, and outputting a second delayed data stream after delaying the first delayed data stream;

a third delayer electrically connected to the second delayer, for receiving the second delayed data stream, and outputting a third delayed data stream after delaying the second delayed data stream;

a multiplexer electrically connected to the first delayer, the second delayer, and the third delayer, for selecting one of the first delayed data stream, the second delayed data stream, and the third delayed data stream according to the shift control signal, and outputting it as the selected delayed data stream.

5. The data recovery apparatus as claimed in claim 1, wherein the detection window unit comprises:

a fourth delayer electrically connected to the delay selector, for receiving the selected delayed data stream output from the delay selector, and outputting a fourth delayed data stream after delaying the selected delayed data stream;

a fifth delayer electrically connected to the fourth delayer, for receiving the fourth delayed data stream, and outputting a fifth delayed data stream after delaying the fourth delayed data stream; and a sixth delayer electrically connected to the fifth delayer, for receiving the fifth delayed data stream, and outputting a sixth delayed data stream after delaying the fifth delayed data stream;

wherein the data sampler samples the fourth delayed data stream, the fifth delayed data stream, and the sixth delayed data stream according to each of the sampling clocks output from the phase lock loop, and outputs the sampled results to the processing unit.

6. The data recovery apparatus as claimed in claim 1, wherein the processing unit comprises:

a synchronizer electrically connected to the sampling unit, for synchronizing the sampled results output from the sampling unit;

a phase detector electrically connected to the synchronizer, for detecting whether each step of the period T of the original data stream leafs or lags the timing of the original clock by comparing the output of the synchronizer, and outputting phase detected results corresponding to each step of the period T;

a voter electrically connected to the phase detector, for determining and outputting period phase detected results according to the phase detected result corresponding to each step in the current period T; and a shift selector electrically connected to the voter, for receiving the period phase detected result, and generating the shift control signal according to the period phase selection result to control the delay selector for determining the delay time of the original data stream;

wherein the synchronizer further selects N data from the sampled results output from the sampling unit according to selection results of the shift selector, and outputs the N selected data as the recovery data according to the timing of the internal clock.

7. A data recovery method for recovering at least an original clock and at least an original data stream provided by a transmitter to at least one recovery data, wherein the original data stream comprises N steps in a period T of the original clock, N is an integer larger than 0, and the data recovery method comprises:

a. sampling the original data stream according to the original clock, wherein corresponding data of the original data stream are sampled for three time with T/(4N) sample period in each step; and b. comparing the sampled results in each step to obtain a compared result of whether the original data stream leads or lags the original data, and recovering the sampled results to the recovery data according to the compared result, wherein the Step a comprises:

generating a least an internal clock and N sampling clocks with different phases according to the original clock;

determining a delay time of the original data stream according to a shift control signal, and outputting selected delay data streams;

delaying the selected and outputted data streams to output at least three data streams with different phases accordingly; and sampling the at least three data streams according to each of the sampling clocks, and outputting sampled results accordingly.

8. The data recovery method as claimed in claim 7, wherein the Step b comprises:

synchronizing the sampled results of Step a;

detecting whether each step of the period T of the original data stream leads or lags the timing of the original clock by comparing the synchronized sampled results;

determining the period phase detected result according to the phase detected result corresponding to each step in the current period T;

selecting one of the sampling clocks as an internal clock according to the period phase detected result;

selecting N data from the sampled results according to the selection results; and outputting the N selected data as the recovery data according to the timing of the internal clock.

9. A data recovery method for recovering at least an original clock and at least an original data stream provided by a transmitter to at least one recovery data, wherein each of the original data stream and the recovery data comprises N steps in a period T of the original clock, N is an integer larger than 0, and the data recovery method comprises:

a. changing the phase of the original data stream according to a shift control signal to obtain at least three data streams with different phases;

b. generating at least N sampling clocks with different phases according to the original clock;

c. sampling the three data streams with different phases obtained in Step a according to the timing of the N sampling clocks in Step b; and d. comparing the sampled results in Step c to obtain a compared result of whether the original data stream leads or lags the original data, and recovering the sampled results to the recovery data according to the compared result, wherein the phase difference of the three data streams with different phases in the Step a is a time of T/(4N).

10. The data recovery method as claimed in claim 9, wherein the phase difference of the N sampling clocks with different phases in the Step b is a time of T/N.

11. The data recovery method as claimed in claim 9, wherein the Step a comprises:

determining the delay time of the original data stream according to the shift control signal, and obtaining a selected delayed data stream; and delaying the selected delayed data stream to obtain the at least three data streams with different phases.

12. The data recovery method as claimed in claim 9, wherein the Step d comprises:

generating an internal clock according to the original clock;

synchronizing the sampled results of Step c;

detecting whether each step of the period T of the original data stream leads or lags the timing of the original clock by comparing the synchronized sampled results;

determining the period phase detected result according to the phase detected result corresponding to each step in the current period T;

determining the delay time of the original data stream according to the shift control signal generated by the phase detected result;

selecting N data from the sampled results according to the selection results; and outputting the N selected data as the recovery data according to the timing of the internal clock.

* * * * *